United States Patent [19]
Kondou et al.

[11] Patent Number: 6,143,437
[45] Date of Patent: Nov. 7, 2000

[54] VAPOR DEPOSITION MATERIAL

[75] Inventors: Satoshi Kondou; Yoshitaka Kubota, both of Kanagawa, Japan

[73] Assignee: Tosoh Corporation, Yamaguchi, Japan

[21] Appl. No.: 09/236,334

[22] Filed: Jan. 25, 1999

[30] Foreign Application Priority Data

Jan. 23, 1998 [JP] Japan .................................. 10-011053

[51] Int. Cl.[7] ...................................................... B32B 7/00
[52] U.S. Cl. .......................... 428/701; 428/702; 501/103; 427/566; 427/585; 427/596; 427/255.32
[58] Field of Search ............................ 501/103; 427/566, 427/585, 596, 255.32; 428/701, 702

[56] References Cited

FOREIGN PATENT DOCUMENTS 0 812 931 A1  11/1997  European Pat. Off. .
43 02 167 C1   2/1994  Germany .

Primary Examiner—Deborah Jones
Assistant Examiner—Jason D Resnick
Attorney, Agent, or Firm—Sughrue, Mion, Zinn, Macpeak & Seas, PLLC

[57] ABSTRACT

A vapor deposition material which is a molded body composed of powdery zirconia and a stabilizer, the molded body having a fine structure constituted of a mixture of granules of zirconia particles and non-granulated particles; granules of particle diameter ranging from 20 to 300 $\mu$m constitute 20 to 90% of the molded body; the granules of the zirconia particles containing substantially no stabilizer, and being constituted of crystals of a monoclinic phase and a cubic phase with a ratio of the monoclinic phase of 70% or higher; and the particles constituting the granules having an average particle diameter from 0.5 to 15 $\mu$m. A process for vapor deposition which employs the above vapor deposition material, and further a member is provided of a base article coated directly, or with interposition of a third film, with a thin zirconia film. The vapor deposition coating material has improved thermal shock resistance on EB irradiation, not causing abrupt boiling of molten matter formed by EB irradiation, being capable of forming stable melt pool, and having a stable evaporation rate.

10 Claims, 2 Drawing Sheets (Fig. 1)
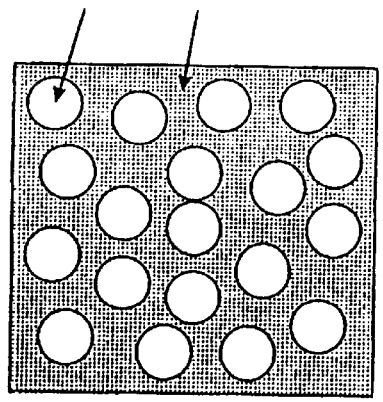
GRANULE  NON-GRANULATED PARTICLE
(Fig. 2)
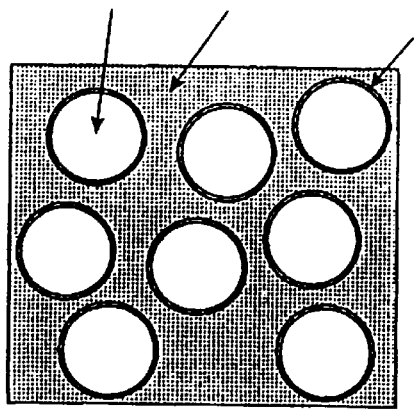
GRANULE  NON-GRAULATED PARTICLE
REACTED PORTION (Fig. 3)
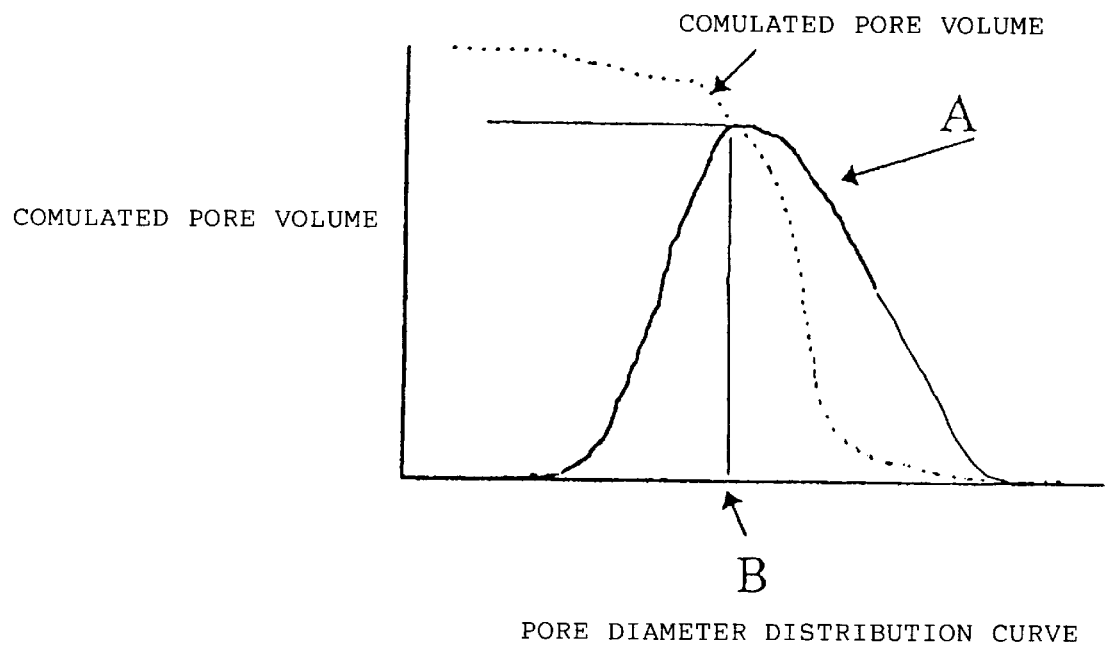

VAPOR DEPOSITION MATERIAL

BACKGROUND OF THE INVENTION

1. Field of the Invention

The present invention relates to a vapor deposition coating material having a high heat resistance and a high thermal shock resistance and being capable of forming a stable melt pool in vapor deposition for forming a coating film.

2. Description of the Related Art

Heat-resistant coating films are generally formed by flame spray coating. With the demand for improved properties of the coating films and as the result of the progress of the vapor deposition technique, physical vapor deposition (hereinafter referred to as PVD) has come to be practically employed for formation of heat-resistant coating films. Especially, PVD processes employing an electron beam (EB-PVD) are attracting attention, and various methods have been developed for forming a heat resistant coating film by the EB-PVD process as disclosed in ADVANCED MATERIALS & PROCESS, Vol. 140, No.6, p.18–22 (1991).

The aforementioned EB-PVD process for heat-resistant film formation is employed for heat-resistant coating of parts of aircraft engines and like parts. The vapor deposition material for coating of engine parts is required to have sufficiently high heat resistance to withstand the direct contact with a high-temperature combustion gas, for which the material should have sufficiently high melting points and a sufficiently high purity. The coating material for engine parts is required also to be sufficiently adhesive to metal parts, not to exfoliate in heating cycles, not to be corroded by a combustion gas component, to have low thermal conductivity, and to maximize the lowering of the surface temperature of the metal parts for improving the durability of the metal parts to achieve the object of the coating film. Few kinds of materials are available to meet the above requirements. Molded bodies of zirconia powders containing a stabilizer such as yttria are used for such purpose.

Such a vapor deposition material composed of zirconia containing a stabilizer, which has a high melting point, is formed into a film by EB vapor deposition employing a high-energy electron beam for the purpose of forming the vapor deposition film at a high-speed. In the EB vapor deposition method, a vapor deposition material placed in a crucible is irradiated with a high-energy electron beam violently, whereby a usual molded body of the vapor deposition material is broken by thermal shock. The breakdown of the vapor deposition material body hinders the stable feed of the vapor of the deposition material to lower the quality of the vapor-deposited film. Therefore, the vapor deposition material body should not be broken by the electron beam in the practice of vapor deposition.

Various vapor deposition material bodies are disclosed which are not broken by the shock of the electron beam. To improve the heat resistance and the thermal shock resistance against the electron beam, a method is disclosed in which the vapor deposition material body is made porous.

For example, DE4302167C1 discloses a vapor deposition material body composed of zirconia containing as a stabilizer yttrium at a content ranging from 0.5 to 25% by weight, being made porous to have a density ranging from 3.0 to 4.5 g/cm³₁, and containing monoclinic phase at a phase ratio ranging from 5 to 80%, whereby the breakdown caused by EB irradiation is prevented. This vapor deposition material, however, does not have sufficient heat resistance and thermal shock resistance, and the material body is cracked by violent heating by high-energy EB irradiation to render steady operation impossible.

JP-A-7-82019 discloses a vapor deposition material for heat resistant coating film, formed from a zirconia-containing porous sintered body. This sintered body is prepared by granulating a mixture of particulate zirconia having a purity of 99.8% or higher and a particle diameter ranging from 0.01 to 10 $\mu$m, and particulate yttria having a particle diameter of 1 $\mu$m or less to have granules of a diameter ranging from 45 to 300 $\mu$m constituting 70% or more of the entire granules, heat-treating the granules to obtain a zirconia-containing sintered body containing granules of diameters from 45 to 300 $\mu$m diameter at a content of 50% or more. The sintered body has a porosity ranging from 25 to 50%, and 70% or more of the pores are in a pore diameter range from 0.1 to 50 $\mu$m. A thermal shock resistant and heat resistant coating film can be prepared from this vapor deposition material. However, this vapor deposition material, in which solid solubilization of the stabilizer tends to proceed, shrinks remarkably on EB irradiation. Therefore, the material comes to be cracked by shrinkage around the portion melted by EB irradiation, which renders the vapor deposition process unstable.

SUMMARY OF THE INVENTION

The present invention intends to provide a novel vapor deposition coating material which has improved thermal shock resistance on EB irradiation, forms a stable melt pool without causing abrupt boiling of molten matter formed by EB irradiation, forms a stable melt pool, and evaporates at a stable evaporation rate.

The present invention intends also to provide a vapor deposition process employing the vapor deposition material, and to provide an article constituted of a base member coated directly, or with interposition of a third film, with a thin zirconia film.

The present invention has been accomplished after comprehensive study to solve the problems of the prior art by the inventors of the present invention.

The vapor deposition material of the present invention is a molded body which is composed of powdery zirconia and a stabilizer, the molded body having a fine structure constituted of a mixture of granules of zirconia particles and non-granulated particles; 20 to 90% of the molded body being constituted of granules of a particle diameter ranging from 20 to 300 $\mu$m; the granules of the zirconia particles containing substantially no stabilizer, and being constituted of crystals of a monoclinic phase and a cubic phase with a ratio of the monoclinic phase of 70% or higher; and the particles constituting the granules having an average particle diameter from 0.5 to 15 $\mu$m.

Preferably, the content of monoclinic phase in the crystal phases in the molded body ranges from 25 to 70%, the content of the tetragonal phase is not higher than 10%, and the balance is a cubic phase therein, the bulk density of the molded body ranges from 3.0 to 5.0 g/cm³, the porosity ranges from 15 to 50%, the mode size of the pores ranges from 0.5 to 3 $\mu$m, and 90% or more of the total pore volume is constituted of the pores of sizes ranging from 0.1 to 5 $\mu$m.

The present invention covers the method of vapor deposition employing the above vapor deposition material, and a member constituted of a base member coated according to the above method directly, or with interposition of a third film, with a thin zirconia film.

BRIEF DESCRIPTION OF THE DRAWINGS

FIG. 1 shows distribution of granules and non-granulated particles in the molded body.

FIG. 2 shows distribution of granules and non-granulated particles in the sintered molded body.

FIG. 3 shows a method for deriving a mode size (B) of pores from a pore size distribution curve.

DESCRIPTION OF THE PREFERRED EMBODIMENT

The vapor deposition material of the present invention is a molded body mainly composed of powdery zirconia and a stabilizer. The molded body may be formed by press molding, sintering, or a like molding method in any shape such as a cylindrical ingot, and grains of several millimeters in diameter.

The stabilizer in the present invention includes yttria, magnesium oxide, calcium oxide, scandium oxide, and oxides of rare earth metals of the sixth period of Group IIIA of the Periodic Table. The stabilizer may be used singly or in combination of two or more thereof. The stabilizer is added in an amount ranging from 0.1 to 40% by weight depending on the use thereof.

The vapor deposition material of the present invention is a molded body which is composed of powdery zirconia and a stabilizer, the molded body having a fine structure constituted of a mixture of granules of zirconia particles and non-granulated particles; granules of a particle diameter of from 20 to 300 μm constituting 20 to 90% of the molded body; the granules of the zirconia particles containing substantially no stabilizer, and being constituted of crystals of a monoclinic phase and a cubic phase with a ratio of the monoclinic phase of 70% or higher; and the particles constituting the granules having an average particle diameter from 0.5 to 15 μm.

The granules of the vapor deposition material having a diameter ranging from 20 to 300 μm constitute 20% or more of the entire molded body of the vapor deposition material. The vapor deposition material having the granules of the above diameter range at a content of less than 20% shrinks remarkably at a high temperature to result in a drop of the heat resistance and the thermal shock resistance. The vapor deposition material having the granules of the above diameter range at a content of more than 90% has mechanical strength insufficient for handling.

The diameter of the granules is controlled to be in the range from 20 to 300 μm. A larger content of the granules of smaller than 20 μm impairs the effect of retarding the sintering in granulation, and of improving the cracking resistance on EB irradiation owing to composite structure formation, whereas a larger content of the granules of larger than 300 μm lowers the mechanical strength to be unsuitable for handling.

The crystal phase of the granule comprises a monoclinic phase and a cubic phase. The granule does not contain a tetragonal phase since the granule does not contain a stabilizer substantially. The content of the monoclinic phase in the granule is controlled to be not less than 70%. At the content less than 70%, the solid-dissolution of the stabilizer proceeds excessively to cause sintering during heating, resulting in a larger crystal particle size to impair the thermal shock resistance undesirably.

The wording "the granule does not contain a stabilizer substantially" herein means that the granule itself is constituted substantially only of zirconia. The vapor deposition material is prepared by mixing granular zirconia containing no stabilizer and a powdery stabilizer, or by mixing granular zirconia containing no stabilizer, a powdery stabilizer, and powdery zirconia. Therefore, the granule is constituted substantially of zirconia only although the stabilizer is slightly dissolved in solid in the contacting surface of granular zirconia containing no stabilizer.

The average particle diameter of the particles constituting the granule is controlled to be not less than 0.5 μm but not more than 15 μm. With the granule-constituting particles having an average diameter of less than 0.5 μm, the molded body shrinks significantly at a high temperature, and is less heat resistant and less thermal shock resistant. With the granule-constituting particles having an average diameter of more than 15 μm, the granules can keep their shape only with difficulty, and the larger particles impair EB meltability of the molded body of the vapor deposition material.

The preferred properties of the molded body of the vapor deposition material are described below.

The molded body contains monoclinic phase in an amount ranging preferably from 25 to 70% by weight of the molded body. With the content of the monoclinic phase lower than 25%, the thermal expansion is excessive, and the crystal particle diameter becomes excessively large to impair the thermal shock resistance. With the ratio of the monoclinic phase higher than 70%, phase transition tends to occur to cause cracking and splitting, and to lower significantly the strength of the molded body.

The bulk density of the molded body ranges preferably from 3.0 to 5.0 g/cm$^3$. The molded body having a bulk density higher than 5.0 g/cm$^3$ is broken by thermal stress on local heating by EB irradiation, whereas the molded body having a bulk density less than 3.0 g/cm$^3$ has lower mechanical strength unsuitable for handling.

The porosity of the molded body ranges preferably from 15 to 50%. The mode size of the pores ranges preferably from 0.5 to 3 μm. The molded body having a porosity less than 15% will be broken on EB irradiation by thermal stress caused by local thermal expansion, whereas the molded body having a porosity more than 50% has low mechanical strength undesirably unsuitable for handling.

The pores in the molded body have a mode diameter ranging preferably from 0.5 to 3 μm, and the volume of pores having a pore diameter of from 0.1 to 5 μm constitutes preferably 90% or more of the entire pore volume. In the molded body containing a large amount of pores of 0.1 mm diameter or smaller, the smaller pores disappear with the progress of sintering by heating on EB vapor deposition, thereby losing the function of the porosity, whereas the molded body containing a large amount of pores of 5 μm diameter or larger has lower mechanical strength and undesirably gives a less stable melt pool. The molded body having the mode pore size of less than 0.5 μm has insufficient thermal shock resistance, since smaller pores are contained more as a whole in the molded body even though the volume of pores of diameters of from 0.1 to 5 μm constitutes 90% or more of the entire pore volume, and the smaller pores tend to disappear on EB vapor deposition. The molded body having the mode pore size more than 3 μm undesirably has lower mechanical strength and gives a less stable melt pool because of a larger content of pores of a larger diameter.

The process for producing the vapor deposition material is described below without limiting the invention.

Powdery zirconia having an average particle diameter ranging from 0.05 to 15 μm and containing no stabilizer is granulated to prepare granules having particle size within a prescribed range. The powdery zirconia, if it has the average particle diameter larger than the prescribed particle size range as the source material, is disintegrated before use by a ball mill or a like apparatus into particles of a size within the prescribed diameter range. The process of granulation is not especially limited. For example, a slurry of powdery zirconia is dried by means of a usual drying apparatus such as a spray drier to form granules. The granulation can be facilitated by addition of an organic binder.

The obtained granular matter is heat-treated. The heat treatment temperature is not limited, provided that the granular matter is sintered at a temperature higher than the temperature for removing the binder and adsorbed matter. The sintering temperature is preferably not lower than 1000°

C., more preferably not lower than 1400° C. This sintering treatment is effective in decreasing the shrinkage caused by sintering on heating with an electron beam. In the case where the powdery zirconia as the source material has an average diameter smaller than that defined in claim 1 (average particle diameter ranging from 0.5 to 15 μm), the heat treatment temperature is adjusted so as to obtain the average particle diameter within the range from 0.5 to 15 μm.

To the heat-treated granular matter, a stabilizer is added in a prescribed amount to prepare a powdery mixture for the intended molded body. Otherwise, to the heat-treated granular matter, powdery zirconia of an average particle diameter ranging from 0.05 to 10 μm, and a stabilizer are added, respectively, in a prescribed amount to prepare a powder mixture for the intended molded body. The mixture is blended to obtain a powdery matter for preparing the molded body. The method of blending is not especially limited. For example, the powdery mixture is dispersed and mixed in a solvent, and the resulting slurry is dried by a usual drying apparatus such as a spray drier, a vacuum drier, and a filter press. In this mixing treatment, the granules constituted only of powdery zirconia may partly be collapsed into a powder state. This causes no problem provided that the powder after the mixing treatment contains granules of the particle diameter ranging from 20 to 300 μm in a proportion of from 20 to 90%. However, mixing is conducted preferably not to cause collapse of the granules. The final proportion of the granules in the molded body is adjusted by changing the composition of the granular matter and other powdery matter.

The mixed powdery matter is molded usually in a rubber mold or a like mold by means of a cold hydrostatic pressing apparatus to obtain cylindrical molded bodies of the present invention. The molding pressure is not especially limited in the present invention.

In the case where the powdery source material is used in a grain state, the powder is grained in an appropriate size. The graining method is not especially limited. For example, the powder can be is grained by direct rolling. The graining can be facilitated by addition of an organic binder or a like additive.

The obtained molded body is usually heat-treated. The heat treatment temperature is not limited provided that the temperature is higher than the temperature for removing the binder and the adsorbed matter. The sintering temperature is preferably not lower than 1000° C., more preferably not lower than 1400° C. This sintering treatment is effective in decreasing the shrinkage caused by sintering by heating with an electron beam. However, the molded body itself before the above heat treatment shrinks little, the shrinkage ratio being not more than 5% at heat treatment at 1450° C.

The molded body prepared as above has a micro-structure in which the granules having a larger diameter keep the original shape, and the granules and non-granulated particles are mixed as shown in FIG. 1. In mixing of the granules and the non-granulated powdery matter, the granules may be collapsed partly depending on the mixing conditions. This causes no problem, provided that the powder after the mixing treatment contains granules of the particle diameter ranging from 20 to 300 μm in a proportion ranging from 20 to 90%.

The granules constituted of particulate zirconia may react with the stabilizer in the periphery of the granules in the heat treatment. However, the reaction can occur only on the surface portions of the granules. Therefore, no problem is caused thereby, provided that the crystal system of the granules is constituted of a monoclinic phase and a cubic phase at the ratio of the monoclinic phase of not less than 70%, and the granules do not contain the stabilizer substantially.

In heat treatment of the molded body at 1400° C., for example, the stabilizer in the periphery of the granules can be dissolved in solid in the portion of the granule to form a tetragonal phase or a cubic phase. In such a case also, the ratio of the monoclinic phase should be not less than 70% in the granules. The granules a monoclinic phase ratio of less than 70% shrink significantly in heating. Thus, on heating by EB irradiation, the stress by shrinkage is larger in the periphery of the melted portion, tending to disadvantageously cause cracking of the molded body.

The granule contains little amount of the stabilizer, and has a monoclinic phase in a high phase ratio. Therefore, the granule has therein many micro-cracks which are effective in retarding development of cracking. Since the granules are hardly sintered together, the presence of the granules is effective in preventing crack development caused by shrinkage resulting from sintering by heating by EB irradiation. For achieving the above effect, the proportion of the granules of the particle diameter ranging from 20 to 300 μm should be in the range from 20 to 90% of the molded body. When the proportion of the granules of the particle diameter ranging from 20 to 300 μm is less than 20%, the molded body shrinks remarkably in the heat treatment, whereas when the above proportion is more than 90%, the molded body has mechanical strength insufficient for handling.

The diameter of the granules is controlled to be in the range from 20 to 300 μm. A larger content of the granules of smaller than 20 μm impairs the effect of retarding the sintering in granulation, and of improving the cracking resistance on EB irradiation owing to composite structure formation, whereas a larger content of the granules of larger than 300 μm lowers the mechanical strength to be unsuitable for handling.

The crystal phase of the molded body obtained as above is usually constituted of a monoclinic phase, a cubic phase, and only a small proportion of a tetragonal phase. In the case where the stabilizer is dissolved in the solid uniformly in the molded body and the composition ratio of zirconia and the stabilizer varies little throughout the molded body, heat treatment of the molded body at a high temperature increases the tetragonal phase in the molded body. Some stabilizers promote sintering. Therefore, a molded body constituted of a uniform solid solution containing a larger amount of the tetragonal phase has excessively large crystal particles grown by heating undesirably to have a lower thermal shock resistance. The wording of "only a small proportion of a tetragonal phase" herein means that the peak of the tetragonal phase (400) is not detected substantially by X-ray diffraction.

The monoclinic phase is contained in the molded body at a content ranging preferably from 25 to 70%, more preferably from 30 to 65%.

The monoclinic phase undergoes phase transition to a tetragonal phase by heating to a temperature of 1000° C. or higher. The phase transition causes decrease of the volume by about 4%. This shrinkage by the phase transition cancels the expansion of the molded body by thermal expansion. The monoclinic phase induces many micro-cracks in the molded body. The micro-cracks serve to stop the spread of cracks at breaking of the molded body. Therefore, the presence of the monoclinic phase contributes effectively to improvement of the thermal shock resistance of the molded body. At the monoclinic phase ratio less than 25%, such effects are not sufficient, whereas at the ratio of more than 70%, the volume change by the phase transition is excessively large to cause cracks in the molded body.

The porosity of the obtained molded body ranges preferably from 15 to 50%. The mode size of the pores ranges preferably from 0.5 to 3 μm. The volume of pores of 0.1 to 5 μm is preferably not less than 90% of the total pore volume.

The above porous structure protects the molded body from the breakdown caused by thermal expansion by local heating by electron beam irradiation. For this purpose, the porosity is controlled to be in the range preferably from 15 to 50%. The molded body having a porosity less than 15% will be broken by thermal stress by local thermal expansion on EB irradiation, whereas the molded body having a porosity more than 50% undesirably has a lower mechanical strength not sufficient for handling. Further, the extremely small pores can disappear readily on heating by EB irradiation, not serving effectively, and facilitate sintering to lower the thermal shock resistance of the molded body, whereas the larger pores lower the mechanical strength of the molded body of the vapor deposition material, and make the melt pool unstable in vapor deposition. Accordingly, the volume of pores of 0.1 to 5 $\mu$m is preferably not less than 90% of the total pore volume. With the pore volume within this range, in the case where the pores of a smaller size are contained in a larger number, for example the volume of pores of 0.1 to 0.4 $\mu$m constitutes 90% or more of the total pore volume, the smaller pores tend to disappear with the progress of sintering by heating for EB vapor deposition to disadvantageously lower the thermal shock resistance. Therefore, the mode size of the pores is preferably in the range from 0.5 to 3 $\mu$m. The moderately larger mode size of the pores improves the thermal shock resistance of the molded body.

As described above, a novel vapor deposition material for heat-resistant coating is provided by selecting the properties of the source powder materials and the mixing conditions to obtain desired properties of the vapor deposition material and molding and sintering the powder mixture. The resulting vapor deposition material enables stable vapor deposition without cracking of the molded body under EB irradiation.

The present invention includes also the process of vapor-depositing the above vapor deposition material for coating by means of an energy beam irradiation type of vapor deposition like electron beam irradiation, and the member prepared by coating a base article directly or with interposition of a third layer according to the process above.

The present invention is described more specifically by reference to Examples without limiting the invention in any way.

EXAMPLE 1

Powdery zirconia of an average particle diameter of 0.2 $\mu$m was granulated into a granular matter having an average particle diameter of 50 $\mu$m. This granulated matter was calcined at 1500° C. To 1.5 liters of water, were added 2500 g of this granulated matter, 287 g of powdery zirconia having an average particle diameter of 5 $\mu$m, and 213 g of powdery yttria having an average particle diameter of 0.2 $\mu$m. The resulting slurry was stirred for 2 hours. The slurry was dried to obtain a powdery matter. The powdery matter was packed into a rubber mold (75 mm in diameter, 180 mm in height), and was molded by means of a cold isostatic pressure molding machine (Model: 4KB×150D×500L, manufactured by Kobe Steel, Ltd.) at a pressure of 0.3 t/cm². The molded body was sintered at 1600° C., and then lathed into a cylinder of 63 mm diameter and 150 mm in height as a molded body of the vapor deposition material.

EXAMPLE 2

Powdery zirconia of an average particle diameter of 0.2 $\mu$m was granulated into a granular matter having an average particle diameter of 70 $\mu$m. This granulated matter was calcined at 1500° C. To 1.5 liters of water, were added 2000 g of this granulated matter, 787 g of powdery zirconia having an average particle diameter of 5 $\mu$m, and 213 g of powdery yttria having an average particle diameter of 0.2 $\mu$m The resulting slurry was stirred for 2 hours. The slurry was dried to obtain a powdery matter. The powdery matter was packed into a rubber mold (75 mm in diameter, 180 mm in height), and was molded by means of a cold isostatic pressure molding machine (Model: 4KB×150D×500L, manufactured by Kobe Steel, Ltd.) at a pressure of 0.3 t/cm². The molded body was sintered at 1600° C., and then lathed into a cylinder of 63 mm diameter and 150 mm in height as a molded body of the vapor deposition material.

EXAMPLE 3

Powdery zirconia of an average particle diameter of 0.2 $\mu$m was granulated into a granular matter having an average particle diameter of 50 $\mu$m. This granulated matter was calcined at 1300° C. To 1.5 liters of water, were added 2500 g of this granulated matter, 287 g of powdery zirconia having an average particle diameter of 5 $\mu$m, and 213 g of powdery yttria having an average particle diameter of 0.2 $\mu$m. The resulting slurry was stirred for 2 hours. The slurry was dried to obtain a powdery matter. The powdery matter was packed into a rubber mold (75 mm in diameter, 180 mm in height), and was molded by means of a cold isostatic pressure molding machine (Model: 4KB×150D×500L, manufactured by Kobe Steel, Ltd.) at a pressure of 0.3 t/cm². The molded body was sintered at 1550° C., and then lathed into a cylinder of 63 mm diameter and 150 mm in height as a molded body of the vapor deposition material.

COMPARATIVE EXAMPLE 1

To 1.5 liters of water, were added 2787 g of powdery zirconia having an average particle diameter of 3 $\mu$m, and 213 g of powdery yttria having an average particle diameter of 0.2 $\mu$m. The resulting slurry was ground and mixed by a ball mill for 16 hours. The mixture was dried to obtain a powdery matter. The powdery matter was packed into a rubber mold (75 mm in diameter, 180 mm in height), and was molded by means of a cold isostatic pressure molding machine (Model: 4KB×150D×500L, manufactured by Kobe Steel, Ltd.) at a pressure of 1 t/cm². The molded body was lathed, and then sintered at 1400° C. to obtain a cylindrical molded body of 63 mm diameter and 150 mm in height as a vapor deposition material.

COMPARATIVE EXAMPLE 2

Powdery zirconia of an average particle diameter of 0.2 $\mu$m was granulated into a granular matter having an average particle diameter of 50 $\mu$m. This granulated matter was calcined at 1500° C. To 1.5 liters of water, were added 387 g of this granulated matter, 2400 g of powdery zirconia having an average particle diameter of 5 $\mu$m, and 213 g of powdery yttria having an average particle diameter of 0.2 $\mu$m. The resulting slurry was stirred for 2 hours. The slurry was dried to obtain a powdery matter. The powdery matter was packed into a rubber mold (75 mm in diameter, 180 mm in height), and was molded by means of a cold isostatic pressure molding machine (Model: 4KB×150D×500L, manufactured by Kobe Steel, Ltd.) at a pressure of 1 t/cm². The molded body was lathed, and then sintered at 1400° C. to obtain a cylindrical molded body of 63 mm diameter and 150 mm in height as a vapor deposition material.

COMPARATIVE EXAMPLE 3

To 1.5 liters of water, were added 2323 g of powdery zirconia having an average particle diameter of 0.2 $\mu$m, and 177 g of powdery yttria having an average particle diameter of 0.2 $\mu$m. The resulting slurry was ground and mixed by a ball mill for 16 hours. The mixture was dried to obtain a powdery matter. The dried powdery matter was granulated into a granular matter having an average particle diameter of 50 μm. This granulated matter was calcined at 1500° C. To 1.5 liters of water, were added 2500 g of the granulated matter, 464 g of powdery zirconia having an average particle diameter of 5 μm, and 35 g of powdery yttria having an average particle diameter of 0.2 μm. The resulting slurry was stirred for 2 hours. The slurry was dried to obtain a powdery matter. The powdery matter was packed into a rubber mold (75 mm in diameter, 180 mm in height), and was molded by means of a cold isostatic pressure molding machine (Model: 4KB×150D×500L, manufactured by Kobe Steel, Ltd.) at a pressure of 0.3 t/cm². The molded body was sintered at 1600° C., and then lathed into a cylinder of 63 mm diameter and 150 mm in height as a molded body of the vapor deposition material.

COMPARATIVE EXAMPLE 4

Powdery zirconia of an average particle diameter of 0.2 μm was granulated into a granular matter having an average particle diameter of 50 μm. This granulated matter was calcined at 1200° C. To 1.5 liters of water, were added 2500 g of the granulated matter, 287 g of powdery zirconia having an average particle diameter of 5 μm, and 213 g of powdery yttria having an average particle diameter of 0.2 μm. The resulting slurry was stirred for 2 hours. The slurry was dried to obtain a powdery matter. The powdery matter was packed into a rubber mold (75 mm in diameter, 180 mm in height), and was molded by means of a cold isostatic pressure molding machine (Model: 4KB×150D×500L, manufactured by Kobe Steel, Ltd.) at a pressure of 1 t/cm². The molded body was sintered at 1250° C., and then lathed into a cylinder of 63 mm diameter and 150 mm in height as a molded body of the vapor deposition material.

The vapor deposition materials obtained in Examples 1–3 and Comparative Examples 1–4 were tested for the proportion (%) of the granules in the vapor deposition material, the ratio (%) of the monoclinic phase in the granules, the particle diameter (μm) of the granules in the molded body, the ratio (%) of the monoclinic phase in the molded body, the porosity (%) of the molded body, the mode size (μm) of the pores, the distribution (%) of the pores of diameter of 0.1 to 5 μm, and the results of EB irradiation test. The results are shown in Table 1.

The tests for the properties of the vapor deposition materials were conducted as below.

Bulk Density

The bulk density was calculated for the cylindrical sample from the weight measured by an electronic balance and the dimensions measured with a micrometer.

Porosity, Pore Diameter Distribution, Pore Mode Size, and Pore Volume

The measurement was conducted with a mercury porosimeter (Pore-Sizer: Model MIC-9320, manufactured by Shimadzu Corporation). The measurement with the mercury porosimeter is conducted by pressing mercury into a porous sample to obtain the cumulative volume of the penetrated mercury with the pressure. The pressure for penetration of mercury into a pore of a certain diameter is represented by Washburn's Equation. The volume of mercury having penetrated into a pore of a certain diameter and pores larger than that is calculated by the relation between the pressure and the cumulated volume of the penetrated mercury according to Washburn's Equation.

The relation between the pore diameter and the pore volume is usually corrected for the surface tension and contact angle of mercury, deviation of the mercury head caused by the structure of the measurement apparatus, and other factors.

The values shown below are derived from the relation between the pore diameter and the cumulative pore volume obtained with the mercury porosimeter. FIG. 3 explains the meaning of the symbols A and B for the measured values.

Porosity (%)

[(Measured total pore volume)/(Apparent volume)] 100%

Mode of Pore Diameter (B)

The mode (B) corresponds to the maximum peak value in the pore diameter distribution curve (A) which is derived from the curve of the relation between the pore diameter and the cumulative pore volume by differentiation.

Average Particle Diameter

The average particle diameter of the powder is derived as follows. The powder particles are molded, the molded body is shaved, and the bared flat face is observed by scanning electron microscopy. The average particle diameter is derived by an intercept method. The average particle size of the vapor deposition material is derived similarly observation of a shaved face by scanning electron microscopy according to an intercept method.

Monoclinic Phase Ratio (%)

The monoclinic phase ratio is derived from diffraction peaks measured by an X-ray diffraction apparatus (Model M×p³ VA, manufactured by MacScience Co.) by calculation according to the equation below.

$$\text{Monoclinic phase ratio (\%)} = \frac{Im(111) + Im(11\bar{1})}{Im(111) + Im(11\bar{1}) + It, c(111)}$$

where

Im(111): Integrated intensity of peaks of monoclinic phase (111)

Im(11$\bar{1}$): Integrated intensity of peaks of monoclinic phase (11$\bar{1}$)

It,c(111): Sum of integrated intensities of peaks of tetragonal phase (111) and cubic phase (111)

Electron Beam Irradiation Test

An electron beam is projected onto the vapor deposition material, and occurrence of cracking in the molded vapor deposition material is observed. The irradiation is conducted at two EB output levels of 0.27 kw and 5 kw.

EB irradiation test 1 Acceleration voltage: 9 kV, current: 30 mA, reduced pressure: 1 to 2×10$^{-5}$ Torr, EB irradiation test 2 Acceleration voltage: 5 kV, current 1 A The present invention provides a vapor deposition coating material which is not cracked even by EB irradiation. This material is useful for heat resistant coating for parts of aircraft engines and the like.

TABLE 1

|  | Example | | | Comparative Example | | | |
| --- | --- | --- | --- | --- | --- | --- | --- |
|  | 1 | 2 | 3 | 1 | 2 | 3 | 4 |
| Proportion of granules (%) | 83 | 66 | 83 | 0 | 12 | 83 | 83 |
| Monoclinic phase ratio in granules (%) | 80 | 82 | 78 | — | 82 | 0 | 72 |
| Average particle diameter of granules (μm) | 6 | 6 | 0.7 | 3 | 6 | 8 | 0.3 |
| Bulk density (g/cm$^3$) | 3.8 | 3.7 | 3.8 | 3.6 | 3.7 | 3.8 | 3.8 |
| Monoclinic phase ratio (%) | 68 | 56 | 43 | 40 | 41 | 8 | 38 |
| Porosity (%) | 38 | 35 | 34 | 36 | 35 | 37 | 31 |
| Mode diameter of pores (μm) | 1.4 | 1.2 | 1.0 | 1.1 | 1.1 | 1.3 | 0.8 |
| Pore diameter distribution (%) | 98 | 98 | 95 | 95 | 95 | 98 | 95 |
| EB irradiation test | Good | Good | Good | Broken | Broken | Broken | Broken |

What is claimed is:

1. A vapor deposition material which is a molded body composed of a powdery zirconia and a stabilizer, the molded body having a fine structure constituted of a mixture of granules of zirconia particles and non-granulated particles of powdery stabilizer and powdery zirconia wherein a part of the powdery stabilizer is dissolved in solid form in the powdery zirconia; 20 to 90% of the molded body being constituted of granules of a particle diameter ranging from 20 to 300 μm; the granules of the zirconia particles containing substantially no stabilizer, and being constituted of crystals of a monoclinic phase and a cubic phase with a ratio of the monoclinic phase of 70% or higher; and the particles constituting the granules having an average particle diameter from 0.5 to 15 μm.

2. The vapor deposition material according to claim 1, wherein the content of the monoclinic phase in the crystal phases in the molded body ranges from 25 to 70%, the molded body further comprising a tetragonal phase, wherein the content of the tetragonal phase therein is not higher than 10%, and the balance is a cubic phase, the bulk density of the molded body ranges from 3.0 to 5.0 g/cm$^3$, the porosity ranges from 15 to 50%, the mode size of the pores ranges from 0.5 to 3 μm, and 90% or more of the pore volume is constituted of the pores of sizes ranging from 0.1 to 5 μm.

3. A process of vapor deposition, which employs the vapor deposition material set forth in claim 1.

4. The process of vapor deposition according to claim 3, wherein the vapor deposition is conducted by employing electron beam irradiation.

5. A member coated with a thin zirconia film, produced by coating a base article directly, or with interposition of a third layer, by the process set forth in claim 3.

6. A process of vapor deposition, which employs the vapor deposition material set forth in claim 2.

7. The process of vapor deposition according to claim 6, wherein the vapor deposition is conducted by employing electron beam irradiation.

8. A member coated with a thin zirconia film, produced by coating a base article directly, or with interposition of a third layer, by the process set forth in claim 6.

9. A member coated with a thin zirconia film, produced by coating a base article directly, or with interposition of a third layer, by the process set forth in claim 4.

10. A member coated with a thin zirconia film, produced by coating a base article directly, or with interposition of a third layer, by the process set forth in claim 7.

* * * * *